United States Patent [19]

Maruyama et al.

[11] Patent Number: 5,114,878
[45] Date of Patent: May 19, 1992

[54] METHOD OF BONDING BUMPS TO LEADS OF TAB TAPE AND AN APPARATUS FOR ARRANGING BUMPS USED FOR THE SAME

[75] Inventors: Tadakatsu Maruyama; Yasuhide Ohno, both of Kawasaki; Masashi Konda, Tokyo; Tosiharu Kikuchi, Kawasaki; Yasuhiro Suzuki, Kitakyushu; Tomohiro Uno, Kawasaki; Hiroaki Otsuka, Kawasaki; Hiroyuki Tanahashi, Kawasaki, all of Japan

[73] Assignee: Nippon Steel Corporation, Japan

[21] Appl. No.: 669,189

[22] Filed: Mar. 13, 1991

Related U.S. Application Data

[63] Continuation-in-part of Ser. No. 578,491, Sep. 6, 1990.

[30] Foreign Application Priority Data

| Sep. 11, 1989 | [JP] | Japan | 1-234915 |
| Sep. 11, 1989 | [JP] | Japan | 1-234916 |
| Sep. 11, 1989 | [JP] | Japan | 1-234917 |
| Mar. 14, 1990 | [JP] | Japan | 2-064926 |
| Apr. 16, 1990 | [JP] | Japan | 2-101026 |
| Jul. 6, 1990 | [JP] | Japan | 2-179266 |
| Jul. 10, 1990 | [JP] | Japan | 2-183645 |
| Jul. 18, 1990 | [JP] | Japan | 2-189637 |
| Jan. 25, 1991 | [JP] | Japan | 3-025312 |

[51] Int. Cl.$^5$ .................................. H01U 23/48
[52] U.S. Cl. .................................. 437/182; 437/209; 29/845
[58] Field of Search ........ 437/182, 183, 209, 211–212, 437/214, 220; 228/246; 29/525, 827, 844, 845

[56] References Cited

U.S. PATENT DOCUMENTS 5,008,997  4/1991  Phy .................................. 437/209

FOREIGN PATENT DOCUMENTS 57-095640   6/1982  Japan ................................ 437/209
62-286239  12/1987  Japan .
253934   3/1971  U.S.S.R. .......................... 437/209

OTHER PUBLICATIONS

National Technical Report, vol. 31 (1985), No. 3 pp. 116–124.
Electronic Parts and Materials vol. 28, No. 7 (1989) Jul., pp. 66–76.

Primary Examiner—Olik Chaudhuri
Assistant Examiner—Andrew Griffis
Attorney, Agent, or Firm—Pollock, Vande Sande & Priddy

[57] ABSTRACT

A method of bonding bumps to leads of a TAB tape comprises the steps of preparing a substrate which is provided with through-holes, each having a size which will not allow the bumps to pass therethrough, at positions corresponding to bonding positions of the leads of the TAB tape where the bumps are to be bonded; provisionally arranging the bumps at positions of the through-holes at one side of the substrate by reducing a pressure in another side of the substrate opposite to said one side thereof to such the bumps in said through-holes; disposing the substrate on which the bumps are provisionally arranged and said TAB tape in such a positional relationship that said bumps face to the bonding positions of the leads of said TAB tape; and bonding the provisionally arranged bumps to the leads at the bonding positions and an apparatus for arranging bumps in a positional relationship corresponding to bonding positions of leads of a TAB tape.

13 Claims, 14 Drawing Sheets

FIG. 1A
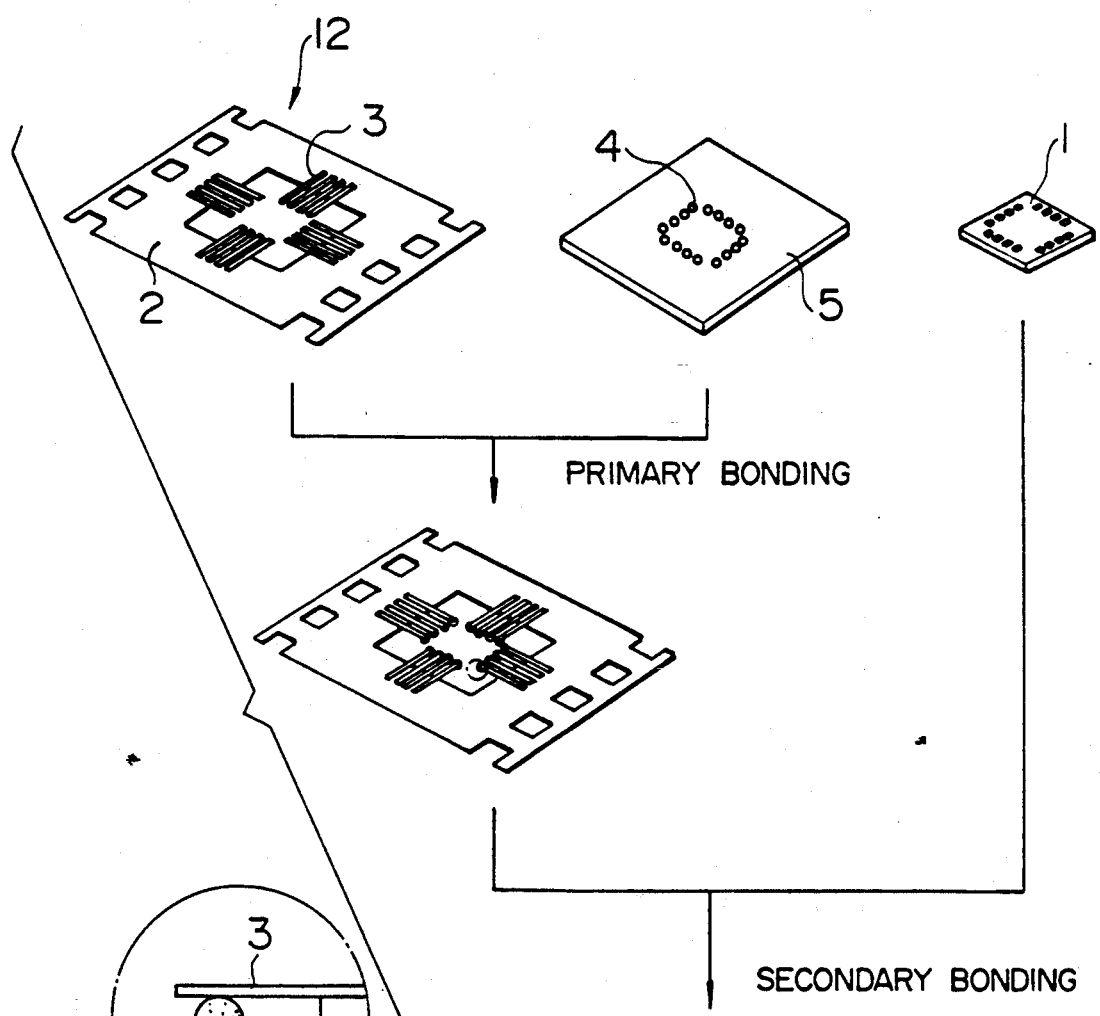
PRIMARY BONDING
SECONDARY BONDING
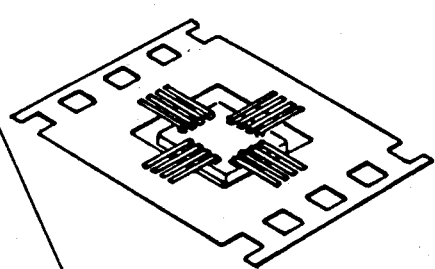
FIG. 1B

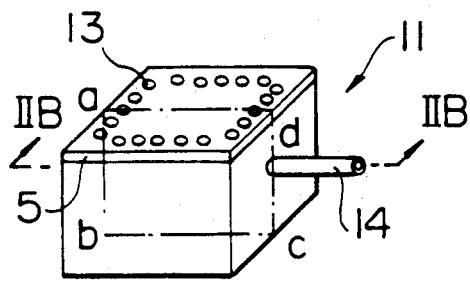
FIG. 2A
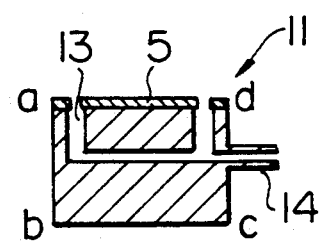
FIG. 2B
FIG. 3A
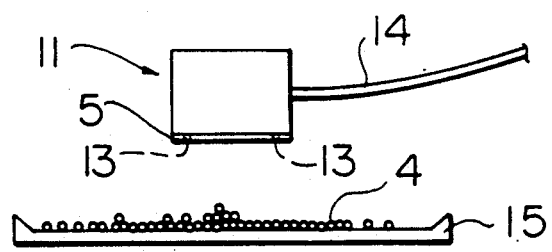
FIG. 3B
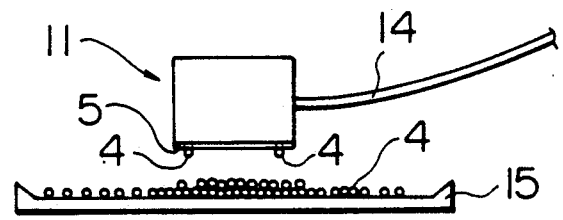
FIG. 3C
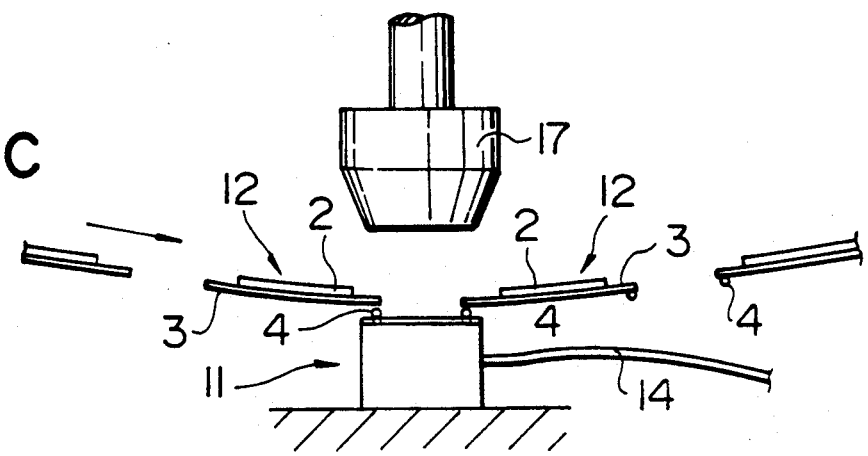

1

METHOD OF BONDING BUMPS TO LEADS OF TAB TAPE AND AN APPARATUS FOR ARRANGING BUMPS USED FOR THE SAME

CROSS-REFERENCE TO RELATED APPLICATION

This application is a continuation-in-part of co-pending U.S. patent application Ser. No. 07/578,491 filed on Sept. 6, 1990.

BACKGROUND OF THE INVENTION

1. Field of the Invention

The present invention relates to a method of bonding bumps of very small metal balls to leads of a TAB tape and an apparatus for arranging bumps used for the same, and in particular to a method of bonding bumps to the tip ends of the leads of a TAB tape for preparing a bump-bonded TAB tape used for TAB (tape Automated Bonding) method which is one of methods of connecting the electrodes of an IC chip with external leads and an apparatus for arranging bumps in a positional relationship corresponding to the lead tip ends of a TAB tape to be bonded.

2. Description of Related Art

A tape Automated bonding (hereinafter referred to as TAB) process is a method of bonding the tip ends of the leads formed in a selected pattern on a TAB tape to the electrodes of an IC chip via metallic bonding projections called as bumps. The bumps are preliminarily mounted either on the leads of the TAB tape or the electrodes of the IC chip and bonding of the TAB tape to the IC chip is performed by heating under pressure by means of a bonding machine. The TAB tape is usually manufactured by forming a film made of a synthetic resin such as polyimide, polyester and the like with sprocket holes or device holes, then laminating a metal foil on the film and thereafter etching the metal foil to form a lead wiring pattern by a photo-resist method.

On the other hand, the bumps through which the TAB tape is connected with the electrodes of semiconductor chips such as ICs and LSIs and the like are often formed on Al electrodes of the semiconductor chips by a plating technique as described in Electronic Part and Materials Vol. 28, No. 7 1989, July, pages 66–76. However, forming bumps on Al electrodes of ICs or LSIs by plating technique costs high and has the possibility of giving damages to the circuits of the semiconductor chip. Therefore, it is not always a preferable process.

One of the methods of forming bumps on the leads of the TAB tape, is disclosed in the Japanese Unexamined Patent Publication No. JP-A-62-28623 and another one, i.e. "a bump transferring method" is described in National Technical Report vol. 31 (1985) No. 3, pages 116–124. The latter method comprises the steps of preliminarily placing bumps on a glass substrate in a predetermined arrangement and transferring the bumps to the leads formed in a selected pattern on a TAB tape.

However, the bump-bonded TAB tapes manufactured by the above methods are not necessarily adequate in view of bonding of the bumps to the electrodes of IC chip, because the bumps are often made in a rectangle-like shape. That is, such TAB tapes involve a problem that the bumps are sometimes bonded to the electrodes of IC chip with variety or less reliability due to the rectangle-like shape, unless the heights of the bumps are accurately equal. Further, since the bumps are formed by plating, there is a restriction such that the material of the bumps must be selected from those alloys or metals which are readily worked by plating.

Spherical bumps are advantageous in view of bonding purpose since they are more deformable than conventional rectangular bumps formed on a glass substrate or the like by plating. However, the spherical bumps involve a problem of how to efficiently arrange the bumps at selected positions and how to readily transfer the bumps to the leads on the TAB tape, since the spherical bumps are manufactured separately before arrangement of the bumps at positions, in contrast to the rectangular bumps which are first formed at selected positions by plating.

SUMMARY OF THE INVENTION

It is a first object of the present invention to provide a method of bonding bumps to the leads of a TAB tape in an efficient and reliable manner without the above-mentioned problems.

It is a second object of the present invention to provide a bump arranging apparatus for arranging bumps in a positional relationship corresponding to the bonding positions of the leads of a TAB tape to be bonded with the bumps and adapted to be used for the above-mentioned method.

According to one aspect of the present invention, a method of bonding bumps to leads of a TAB tape comprises the steps of preparing a substrate which is provided with through-holes, each having a size which will not allow the bumps to pass therethrough, at positions corresponding to bonding positions of the leads of the TAB tape where the bumps are to be bonded; provisionally arranging the bumps at positions of the through-holes at one side of the substrate by reducing a pressure in the other side of the substrate opposite to said one side thereof to suck the bumps in said through-holes; disposing the substrate on which the bumps are provisionally arranged and said TAB tape in such a positional relationship that said bumps face to the bonding positions of the leads of said TAB tape; and bonding the provisionally arranged bumps to the leads at the bonding positions.

According to another aspect of the present invention, an apparatus for arranging bumps in a positional relationship corresponding to bonding positions of leads of a TAB tape comprises a substrate which is provided with through-holes, each having such a size that the bumps to be bonded are not allowed to pass, in a positional relationship corresponding to bonding positions of the leads of the TAB tape; and pressure reducing means including a pressure reducing chamber disposed on a rear side of said substrate opposite to a front side of said substrate on which the bumps are to be arranged for reducing a pressure on the rear side to a pressure lower than that on the front side so that the bumps are sucked to said through-holes.

BRIEF DESCRIPTION OF THE DRAWINGS

FIGS. 1A and 1B are views illustrating the steps of bonding a TAB tape to electrodes of IC chip;

FIGS. 2A and 2B are a perspective view and a sectional view taken along the line IIB to IIB, respectively, showing the structure of a vacuum suction chamber in an embodiment of the present invention;

FIGS. 3A through 3C are views illustrating a bonding process in which provisionally arranged bumps of metal balls are prepared by using a vacuum suction chamber and the provisionally arranged bumps are bonded to the TAB tape leads by a bonding machine;

DESCRIPTION OF THE PREFERRED EMBODIMENTS

Figure 4:
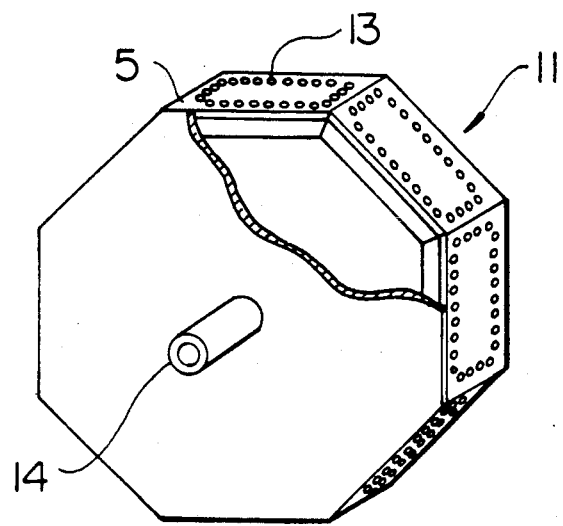
FIG. 4 is a partially removed perspective view showing the structure of a vacuum suction chamber in another embodiment of the present invention.

The TAB process is, as mentioned in hereinbefore, a method of bonding the tip portions of leads, which are formed on a TAB tape in a given pattern, to the electrodes of an IC chip via bonding metal projections which are called as bumps. The present invention is relating to a method of bonding bumps to the leads on the TAB tape for manufacturing bump-bonded TAB tapes used for the TAB method and in particular, the bonding step is made easier by provisional arrangement of the bumps on a substrate in advance. A process in which a bump-bonded TAB tape is manufactured by using provisional arrangement of the bumps and then the leads on the TAB tape are bonded to the electrodes of the IC chip through the bumps will be briefly described with reference to FIG. 1.

As shown in FIG. 1, a TAB tape 12 having a base film 2 and leads 3 which are to be bonded to the electrodes of an IC chip 1 and a substrate 5 on which very small metal balls 4 are provisionally arranged are arranged in a given positional relationship. The metal balls 4 forming bumps are disposed on a multiplicity of through-holes which are formed in the same positional relationship as that of the tip ends of the leads of the TAB tape. The metal balls called as bumps are transferred and bonded to the tip ends of the leads of the TAB tape from the substrate so that a bump-bond TAB tape is manufactured in a first bonding step. Then, the leads of the bump-bonded TAB tape are bonded to the electrodes of an IC chip via the bumps by means of a bonding machine in a second bonding step. The alignment between the leads of the bump-bonded TAB tape and IC chip is automatically or manually achieved by means of a TAB bonding machine and then, the bump-bonded TAB tape is subjected to heating under pressure by a bonding tool so that the leads on the tape are bonded to the electrodes of the IC chip. The TAB tape per se comprises a multiplicity of frames (one for each IC chip) which are consecutively formed in a longitudinal direction thereof. The leads are usually plated with copper, gold or tin and arrayed in a given pattern on an insulative tape made of polyimide and the like. Generally, tapes each wound around a reel are commercially available. The reel is mounted to the bonding machine at the bonding process. When one frame of the tape rewound from the reel is positioned at a bonding stage, the leads on the frame are aligned and then bonded to the electrodes of an IC chip.

Since the bumps are conventionally formed, in most cases, on the IC chip, the leads of the TAB tape do not have the bumps. In contrast to this, the concept of the bump-bonded TAB tape is to use IC chips having no bumps and in stead of this, to preliminarily form bumps on the leads of TAB tape. The present invention is relating to a method of manufacturing bump-bonded TAB tapes. The bumps are bonded to the leads of the TAB tape by conveniently using a thermal pressure bonding effected by urging a heated bonding tool upon the bumps in a manner similarly to the bonding of the leads to the IC chip electrodes, by using the same. In other words, a reel around which a TAB tape having no bumps is wound is mounted on the bonding machine and then spherical bumps are bonded to the tip ends of the leads at its bonding stage.

The bonding stage of the bonding machine generally comprises a bonding platform on which an IC chip is provisionally placed and fixed thereto and a frame-like fixture which pressures the TAB tape against the platform. A mechanism for correcting the relative misalignment therebetween is combined with the bonding stage. In order to bonding the bumps to the leads of the TAB tape by conveniently using such a mechanism of the conventional bonding machine in accordance with the present invention, it is necessary to remove the bonding stage, in particular, the bonding platform on which the IC chip is placed from the bonding machine and to arrange bumps there in a pattern corresponding to the lead pattern of the TAB tape. In other words, the transfer or bonding of the bumps to the leads of the TAB tape can be achieved by using the mechanism of the bonding machine as it is if the arrangement of bumps in a given pattern is realized on the bonding platform.

It is necessary to prepare bump-bonded TAB tapes of high quality in order to provide excellent bonding between the leads of the TAB tape and the electrodes of the IC chip on the secondary bonding. In order to achieve this, the performance of an arrangement substrate on which bumps are preliminarily arranged to be used for the second bonding is important.

One embodiment of a method of bonding bumps to the leads of a TAB tape will now be described with reference to the drawings. A vacuum suction chamber 11 corresponding to a bump suction and provisionally fixing portion disposed on a bonding platform is shown in FIG. 2A. The suction chamber 11 has on the upper side thereof a thin flat plate 5 which is provided with through-holes 13 in positions at which bumps are to be arranged. The plate 5 is corresponding to the arranging substrate 5 of FIG. 1. The through-holes 13 are in communication with a suction port 14 via the vacuum suction chamber 11 as shown in a sectional view of FIG. 2B. Although the suction chamber is made in a form of tunnel extending along the through-holes and communicated with the suction port 14 as shown in FIG. 2B, the suction chamber may be a hollow box-like member including a thin flat plate 5 having through-holes thereon if the upper flat plate provided with through-holes has a sufficient thickness so as to prevent it from being deformed by heat-bonding. The flat plate 5 should be made of material which can provide an even flat surface and can be machined for forming fine through-holes and hardly changes its properties due to heat and pressure applied on bonding. A thin plate of stainless steel, nickel and the like or ceramics and the like is suitable for the material of the flat plate 5.

Then, the vacuum suction chamber 11 which is evacuated via the suction port 14 is located in the vicinity of a bump supply mechanism including a tray 15 on which a multiplicity of bumps 4 are placed as shown in FIG. 3A so that the bumps 4 are sucked and attracted to the through-holes 13 as shown in FIG. 3C. This step is illustrated, in the figure, so as to attract bumps upward by placing the suction chamber upside down and moving it downward to approach the bump. It is possible to adopt a method in which the bumps are dropped upon the upper side provided with the through-holes of the chamber which is located normally or slantingly.

The suction chamber 11 on which bumps are sucked and preliminarily fixed is disposed on the bonding platform of the bonding machine as shown in FIG. 3C. An alignment between a TAB tape 12 having leads 3 formed on a film base made of an insulative material such as polyimide and the like and the suction chamber 11 is performed by using an alignment adjusting mechanism (not shown). After completion of the alignment, a bonding tool 17 which is heated to a suitable temperature is driven to impose a given pressure upon the tape 12, resulting in that the bumps provisionally fixed on the through-holes of the suction chamber 11 are transferred and bonded to the leads of the TAB tape.

The suction chamber 11 from which bumps have been transferred is again returned to a step of FIG. 3A in which bumps are sucked for the next cycle, and simultaneously, the TAB tape is advanced by one frame on the bonding machine and a next frame of the tape is brought into a stand-by position similarly to the previous cycle. It can be understood that the above-mentioned steps provide an efficient method of successively bonding the bumps to the leads on respective frames of the TAB tape which is rewound from the reel.

FIG. 4 shows another embodiment of the vacuum suction chamber. A plurality of thin flat plates 5 having through-holes 13 are arranged along the circumference of a vacuum suction chamber portion 11 which is formed into a shape of polygon so that bump suction and provisional fixing portions are defined thereon. Each of the flat plates 5 forms a bump fixing element which plays a role of suction and fixing of one set of bumps to be arranged. The vacuum suction chamber 11 is mounted on a bonding platform of a bonding machine so that the top side of the suction chamber is located at a position where the conventional bonding platform is to be provided. Although the suction chamber 11 having eight bump fixing elements is exemplarily illustrated in the drawing, it is of course that the number of the elements may be changed if desired. While rotating stepwise the polygonal suction chamber 11 around a shaft 14 also serving as suction port, the suction chamber 11 sucks bumps 4 to the through-holes thereby provisionally fixing them on one of the flat plates 5 which comes the bottom position near a bump supply station including a tray 15 on which the bumps 15 are placed and a bump automatic supply machine 20 in this case. When the one flat plate of the suction chamber on which the bumps are placed comes to the top position, i.e. an upper bonding station, the TAB tape leads are aligned with the bumps fixed on the one flat plate and then the bumps are transferred and bonded to the leads 3. After completion of bonding of the bumps to the leads in one frame of the TAB tape, the suction chamber is rotated by one unit and the TAB tape is advanced by one frame and simultaneously, bumps are supplied from the automatic supply machine. By performing a series of successive operations as mentioned above, transfer and bonding of the bumps to the leads of the TAB tape can be achieved in a very efficient manner.

In the present embodiment, the vacuum suction chamber having through-holes is used to arrange the bumps necessary for one frame of the TAB tape into a given pattern. This makes it possible to smoothly arrange under a sucking force soft metal balls which otherwise readily cause problems such as crushing and contamination. Further, it has become possible to precisely and efficiently bond bumps to the tip ends of the leads of the TAB tape by effectively using main components of a conventional TAB bonding machine and by merely replacing a vacuum suction chamber for the bonding platform.

TEST 1

A vacuum suction chamber 11 as shown in FIG. 2A was made of stainless steel. A flat plate 5 having through-holes applied to the upper side of the box was made of stainless steel plate of 30 μm thickness. The through-holes are made by an etching process. Each through-hole has a diameter of 60 μm. Fifty through-holes were formed along each of four sides and total 200 through-holes along four sides were formed in a shape of a square having four sides, each 10 mm long.

Gold balls, each having a diameter of 80 μm were used as bumps 4. A multiplicity of gold balls were placed on the tray 15. The vacuum suction chamber was brought close to and above the tray 15 so that the gold balls were sucked and fixed to the openings of the through-holes.

The TAB tape 12 was formed so that the tip ends of the leads were aligned with the through-holes of the flat plate and the gold plated copper leads 3 were formed on a polyimide film 2. This tape was preliminarily set in the TAB inner lead bonding machine. One frame of the tape was set on the bonding stage of the bonding machine. Then, the suction chamber 11 having the bumps 4 provisionally fixed on the through-holes 13 was moved to the bonding platform portion of the bonding machine while the suction chamber portion 11 was evacuated.

After the tape was adjusted so that the leads were positioned in alignment with the positions of the gold balls on the suction chamber, the bonding tool 17 which was heated at 450° C. was lowered upon the tape. Bonding was performed under a pressure of 3 kgf (15 gf per one lead) for five seconds.

This caused all gold balls provisionally fixed on the through-holes of the flat plate to be precisely transferred and bonded to the tip ends of the leads of the TAB tape one by one. After bonding, the strength of bonding of the gold balls upon the TAB tape was measured by the shear test method. It was found that every lead stably holds a bonding strength not less than 1.5 gf per one lead which is enough to function as a TAB tape with bumps.

TEST 2

Figure 5:
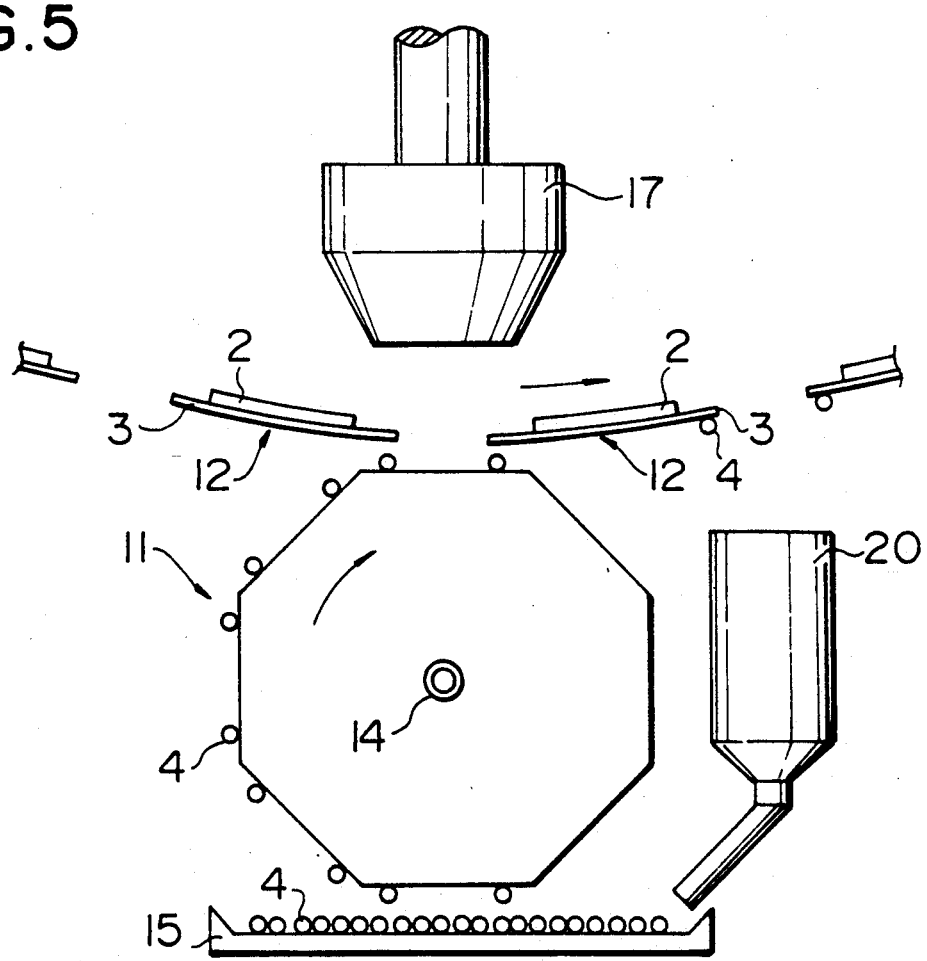
FIG. 5 is a view showing an embodiment in which the vacuum suction chamber is incorporated into a bonding machine.

A vacuum suction chamber 11 having an octagon shape as shown in FIG. 11 was manufactured. The dimension and arrangement of the through-holes 13 of each bump fixing element was identical to those of Test 1. However, the flat plate 5 having the through-holes was made of nickel plate having a thickness of 30 μm manufactured by an electroforming method. As shown in FIG. 5, the vacuum suction chamber was incorporated in the bonding platform of the TAB inner lead bonding machine. A rotary shaft having at one end a suction port was connected with a vacuum pump. A tray 15 on which a multiplicity of bumps of gold balls 4 of 80 μm were placed was disposed below the vacuum suction chamber. The gold balls were automatically replenished to the tray from a supply machine 20 when they were used and reduced. The upper portion of the vacuum suction chamber was corresponding to the bonding platform and intermittently rotated by 45 degrees in one pitch. Whenever the suction chamber is stopped in any position, the upper side thereof was adjusted so that it was in a precisely parallel relationship with the tip end face of the bonding tool 17.

One frame of the TAB tape 12 having the leads 13 corresponding to the pattern of the arranged through-holes of the flat plate was set on the bonding stage similarly to TEST 1. Gold plated leads made of copper were also used in this TEST. When evacuation of the vacuum suction chamber was commenced, the gold balls on the tray were sucked and provisionally secured to the openings of the through-holes on the lower side of the box. Then, the vacuum suction chamber was rotated by only 45 degrees of one pitch, so that the gold balls were sucked and provisionally fixed to the through-holes of the second element. After rotation of the suction chamber by four pitches, the first element having the gold balls provisionally fixed thereto was advanced to a normal position of the bonding platform. In this position, alignment of the leads of the TAB tape with the balls was performed and bonding of the balls to the leads of the tape was performed under a pressure of 3 kgf for 0.5 second by means of a bonding tool 17 heated to 450° C. All gold balls having been provisionally secured to the openings of the through-holes of the flat plate were transferred and bonded to the respective leads of the TAB tape in position.

It is found from this TEST that the bonding strength between the bonded gold balls and the leads is also stably maintained at a value not less than 1.5 gf so that the performance of the TAB tape having bumps can be sufficiently satisfied.

TEST 3

A TAB tape having tin plated leads made of copper which was also used like TEST 2. Bonding conditions of this TEST were same as those of TEST 2 except that the heating temperature of the bonding tool was 300° C.

Also in this TEST, all gold balls were reliably transferred and bonded to the tip ends of the TAB tape leads. The bonding strength is stably maintained at a value not less than 0.7 gf although it is slightly lower than that of the gold plated tape.

TEST 4

Figure 6:
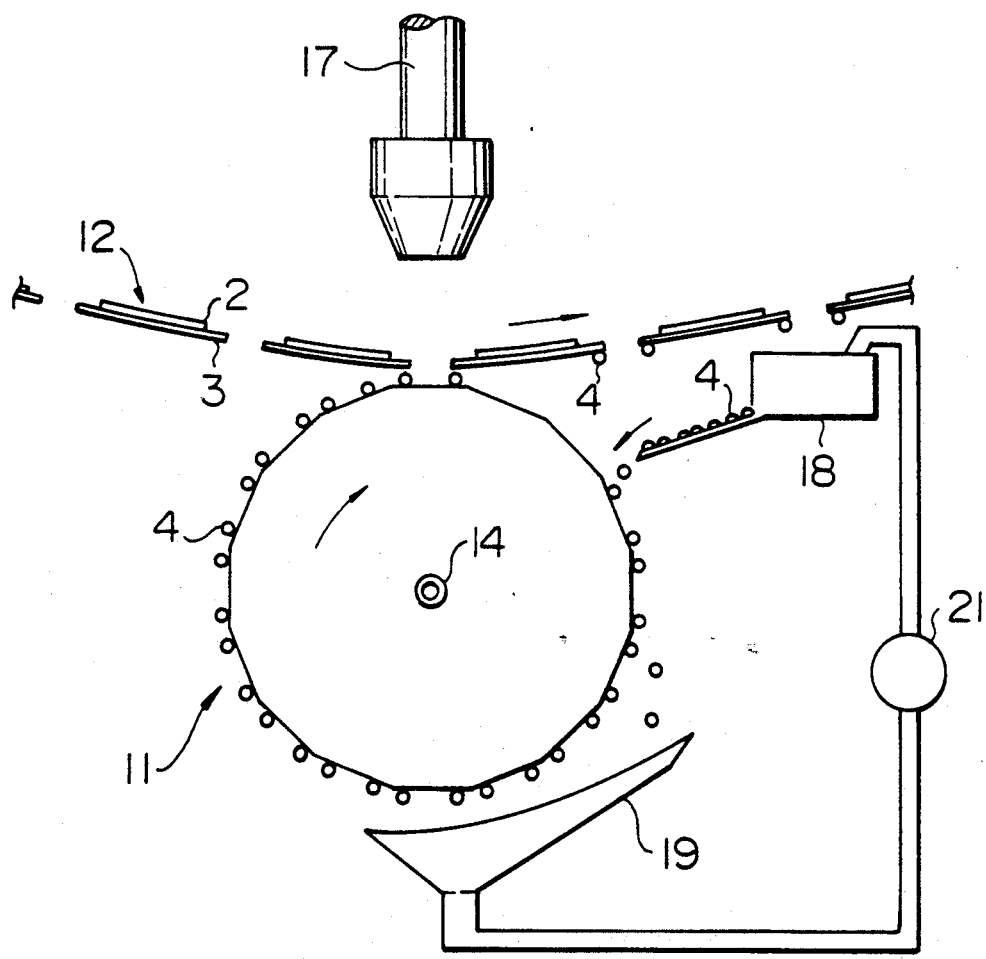
FIG. 6 is a view showing a modification of the embodiment of FIG. 5.
Figure 7:
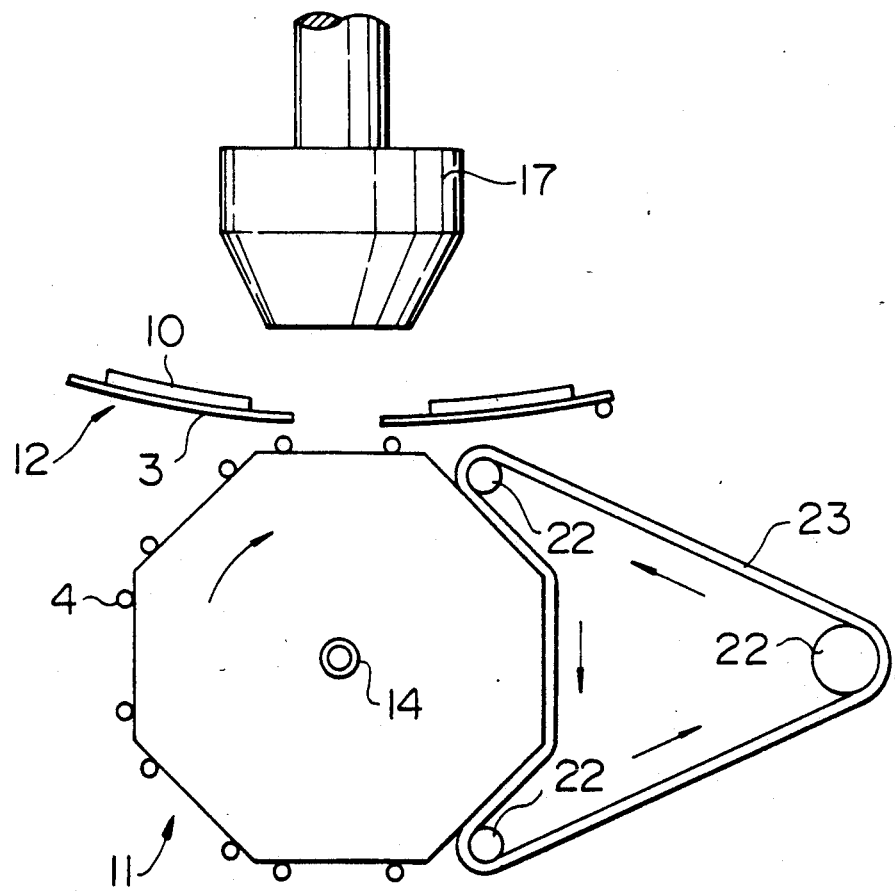
FIG. 7 is a view showing an example of a mechanism for stabilizing suction of the vacuum suction chamber.

A 16-side polygon suction chamber 11 as shown in FIG. 6 was used. The material and size of the flat plate 5 and the size and arrangement of through-holes 13 of each bump fixing element were same as those of TEST 2.

A bump supply mechanism was different from both of the previous TESTs and arranged to include a bump supply 18, a bump receiving tray 19 and a bump returning feeder 21 for returning excess bumps received by the tray 19 as shown in FIG. 6. By the arrangement, it was possible to sprinkle the bumps over the flat plate located in the upper-lateral side of the suction chamber from the bump supply 18. The sprinkled bums 4 were trapped by the openings of the through-holes on the flat plate and provisionally secured thereon. Excess bumps were dropped upon the bump tray 19 located below after all the openings of the through-holes have been occupied by the bumps and then conveyed to the bump supply 18 again.

If a large size polygonal suction chamber used in the TEST 3 is used in the previous TEST 2, the bump suction force may be weakened since air would be introduced through unoccupied openings of the through-holes of the flat plate until next bumps are sucked after transferring of the original bumps. Since the through-holes are small, a vacuum pump having an enough capacity can generate a sucking force enough to suck the bumps even when the through-holes are partially unoccupied. However, if the capacity of the pump is low and/or the drum of the suction chamber becomes larger, the vacuum leakage via the free through-holes is not negligible. It is effective to close the free through-holes by an elastic rubber belt 23 and pulleys 22 in such a case. It is confirmed that the bump supply mechanism formed in this TEST can maintain a sufficient bump sucking force.

In the above-mentioned TESTs, the flat plate on which the bumps are arranged is placed on the bonding platform of the bonding machine and the leads of the TAB tape are aligned with the bumps. Thereafter, bonding of the bumps to leads is carried out by applying a pressure under suitable conditions by means of heated bonding tool. At the next step, it is necessary to separate the leads to which the bumps are bonded from the flat plate having the through-holes together with TAB tape. If the evacuation condition when the bumps are sucked remains on the opposite side of the flat plate, the bonded bumps may be separated from the leads in the course of removal of the TAB tape in some cases since the bumps are continuedly sucked by the vacuum sucking force.

A term "vacuum" used herein means an evacuated state which causes a pressure difference sufficient for sucking small metal balls serving as bumps to through-holes formed in a flat plate. Practically the degree of vacuum which can be readily obtained by a small diaphragm pump, magnet pump, rotary pump and the like is generally satisfactory.

It is confirmed by the inventors' study that a suction force in the order of about 1 gf is applied to one bonded bump having a diameter of 80 microns when the rear side of the flat plate having 200 through-holes, each being 70 microns in diameter is maintained at a reduced pressure lower than the atmospheric pressure by one atm. by means of a diaphragm pump. This suction force is substantially equal to the bonding force between a bump and a lead which are thermally bonded. It is found that when the flat plate having 200 through-holes is additionally formed with a through-hole having a diameter of 70 microns and a vacuum sucking force applied to the 200 through-holes is similarly measured under a condition that this additional through-hole is opened while the 200 through-holes are closed, the suction force per bump is reduced to about 0.1 gf. Even if the additional through-hole remains opened, no difficulty occurs in the operation for sucking the bumps on the 200 through-holes.

It is understood from the foregoing that there is a possibility that some bumps will be separated from the leads once bonded thereto if the TAB tape is forcedly removed while the space below the rear side of the flat plate is left evacuated after bonding the bumps to the leads. In order to avoid this separation, it is effective to reduce the vacuum degree at the rear side of the flat plate immediately prior to advancing of the TAB tape after completion of transferring of the bumps for one frame or alternatively to form a small hole in the flat plate or the vacuum chamber and leave it opened at least if the vacuum degree is maintained.

When a condition which provides greater deformation of the bumps is adopted on bonding, it is useful to apply a force to the bumps so as to forcibly separate the bumps from the through-holes by positively increasing the pressure in the vacuum chamber to a value higher than the atmospheric pressure in addition to introducing air into the chamber. This will achieve a more reliable separation of the TAB tape from the flat plate. Since this method of increasing the inner pressure in the chamber each time when the transfer of the bumps to one frame of the TAB tape is completed may also provide an effect that deposition gradually piles up on the flat plate around the through-holes can be cleaned, this method is advantageous for mass production.

When a switching operation of a change-over valve in a path between the vacuum chamber and an exhaust system is interlinked with the periodical operation of the tool and the like of the bonding step in the above-mentioned process, a bump transfer can be realized as a more reliable and efficient process.

Five embodiments 1 through 5 based on the above-mentioned concept will be described with reference to the drawings.

EMBODIMENT 1

As shown in FIG. 8, a vacuum chamber 11 which is evacuated by a vacuum exhaust system 40 is disposed so that it is positioned below a bonding tool. The upper portion of the vacuum chamber 11 is made of a flat plate 5 which are formed with through-holes 13 in positions at which bumps are to be sucked. A change-over valve 30 is disposed between the vacuum chamber 11 and the vacuum exhaust system 40 so that air is selectively introduced into the chamber 11.

Figure 8A:
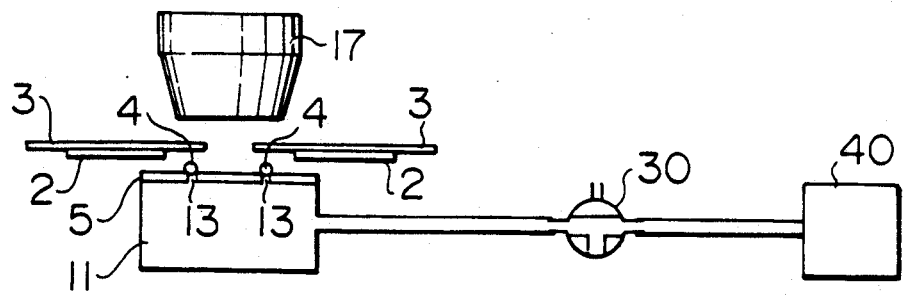
FIGS. 8A through 8D are views showing a mechanism for adjusting the pressure in the vacuum suction chamber when the TAB tape, to which the provisionally arranged bumps have been bonded, is separated from the vacuum suction chamber.
Figure 8B:
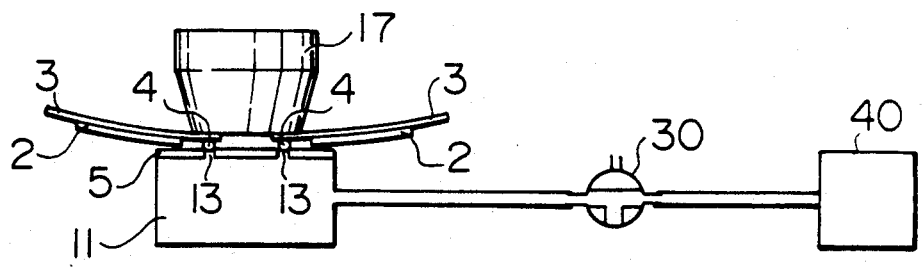

FIG. 8A shows that air is evacuated from the vacuum chamber 11 via the change-over valve 30 and that bumps 4 are sucked to the through-holes of the flat plate by the suction force. The relative positional relations among a TAB tape which is a laminate of gold plated copper leads 3 and a polyimide film 2, the vacuum chamber 11 on which bumps 4 are arranged and the bonding tool 17 can be precisely controlled by means of adjusting mechanism (not shown). Each of the through-holes 13 in the flat plate is 60 $\mu$m in diameter. Gold balls of 80 $\mu$m are used as bumps and a TAB tape having 200 leads each having a width of 60 $\mu$m are used.

Figure 8C:
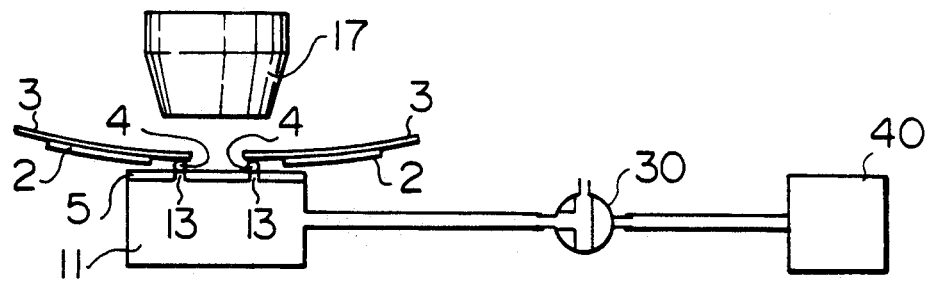
Figure 8D:
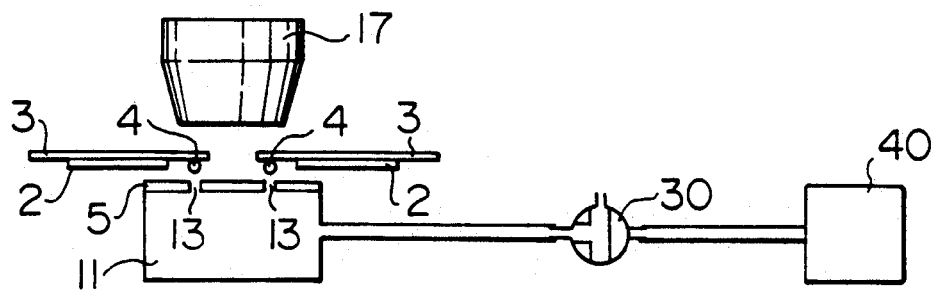
Figure 9A:
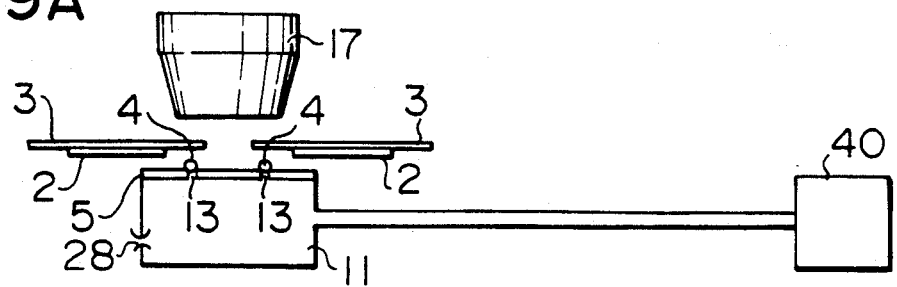
FIGS. 9A through 9D are views showing a modification of the mechanism of FIGS. 8A through 8D.
Figure 9B:
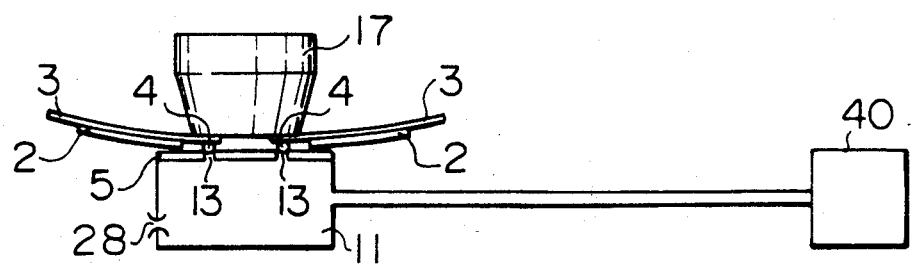

When a pressure is applied upon the leads at 10 gf per lead by lowering the bonding tool which is heated to 450° C., bonding between each lead 3 and bump 4 is performed (FIG. 9B). Then, the pressure in the vacuum chamber is increased to an atmospheric pressure by operating the change-over valve 30 as shown in FIG. 8C. Then the bumps 4 are separated from the through-holes 13 and are completely transferred to the leads 3 (FIG. 8D). Transferring of the bumps to one frame of the TAB tape is completed by the above-mentioned steps. Accordingly, the vacuum chamber 11 is evacuated again by operating the change-over valve 30 to return to the bump suction step for repeating the next cycle.

When the tape is removed by lowering the vacuum chamber 11 while the vacuum chamber 11 is continuedly evacuated without operating the change-over valve 30 after completion of bonding step in the above-mentioned process, some of the bonded bumps 4 may be separated from the leads 3 so that more than half of bumps remain sucked on the through-holes 13 or scattered around the through-holes. In contrast to this, such a problem never occurs in the present embodiment so that very stable transfer of bumps can be conducted.

It is confirmed that no problem occurs even if the timing at which air is introduced into the vacuum chamber 11 is varied over a wide range. Even when an air is introduced into the vacuum chamber by operating the change-over valve 30 at a step of FIG. 8A, that is prior to a step at which the bonding tool is lowered after alignment of the bumps 4 on the through-holes 13 with the leads is completed, the bumps 4 which have been once arranged on the flat plate 5 are held there and all bumps are transferred to proper positions of the leads. In other words, timing of operating the change-over valve 30 is not critical and may be at any time during an interval before the TAB tape is separated after bonding and after alignment of the arranged bumps with the TAB tape is completed.

EMBODIMENT 2

Although an apparatus which is the same as that of the embodiment 1 is used, a change-over valve is not disposed between the vacuum chamber 11 and the vacuum exhaust system 40 and in stead of that a normally opened small hole 28 is formed to the vacuum chamber 11 disposed at the rear side of a flat plate 5 having through-holes 13. The diameter of the through-holes 13 on the flat plate is 60 $\mu$m, gold balls of 80 $\mu$m are used as bumps and a TAB tape having 200 leads each having a width of 60 $\mu$m is used similarly to the embodiment 1.

FIG. 9A shows a step at which the TAB tape having the leads 3 formed on a polyimide film 2 is disposed below a bonding tool 17 after the bumps 4 are sucked upon the through-holes 13 of the flat plate 5, and alignment between the leads 3 and the bumps 4 is completed by an alignment mechanism (not shown). Although the small hole 28 is opened, small size bumps 4 are sucked in the openings of the through-holes 13 of the flat plate 5 without causing any problem.

Figure 9C:
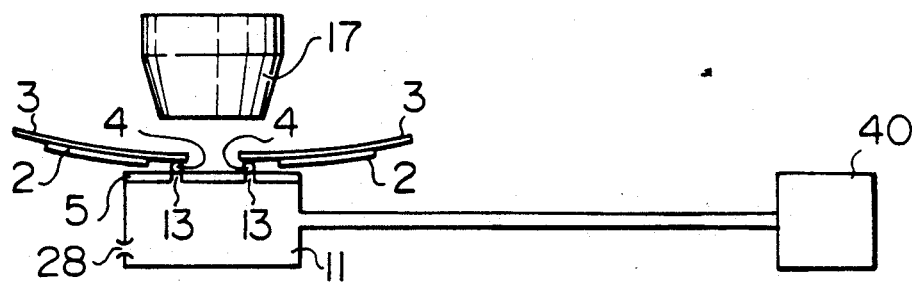
Figure 9D:
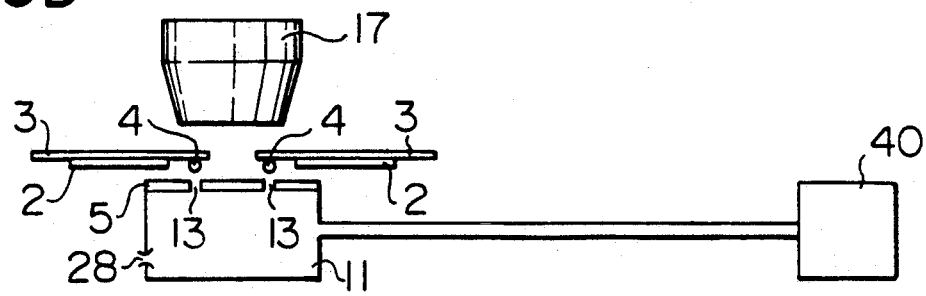

Then, pressure bonding is performed at a pressure of 10 gf per lead by lowering the bonding tool 17 which is heated to 450° C. as shown in FIG. 9B. Then, the bonding tool is returned to an original stand-by position (FIG. 9C), and thereafter the TAB tape is separated by lowering the vacuum chamber 11 and all the bumps are transferred to the leads of the tape as shown in FIG. 9D. The next bumps are sucked to the through-holes 13 of the flat plate 5 after advancing the TAB by one frame. The process is thus returned to the step of FIG. 9A.

EMBODIMENT 3

Figure 10A:
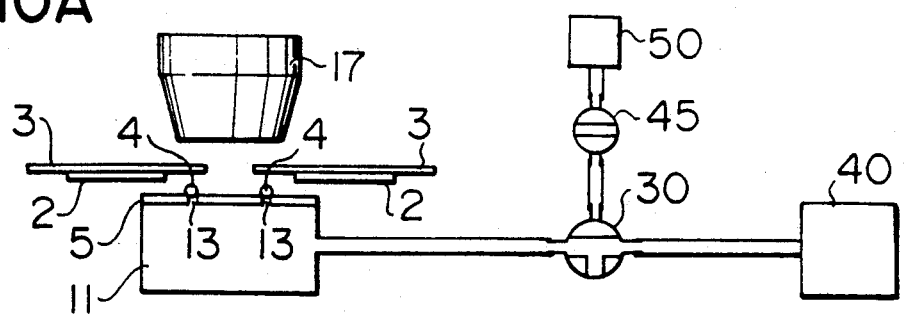
FIGS. 10A through 10D are views showing another modification of the mechanism of FIGS. 8A through 8D.

A pressure increasing mechanism is incorporated into the apparatus of the embodiment 1 to provide an arrangement shown in FIG. 10A. A reference number 50 denotes a pressurized air cylinder of which an outlet pressure is adjusted to 0.5 atm and a reference numeral 45 denotes a valve for opening and closing a passage of pressurized air. The sizes of a flat plate 5, through-holes 13, bumps 4 and TAB tape are all same as those of the embodiment 5.

Figure 10B:
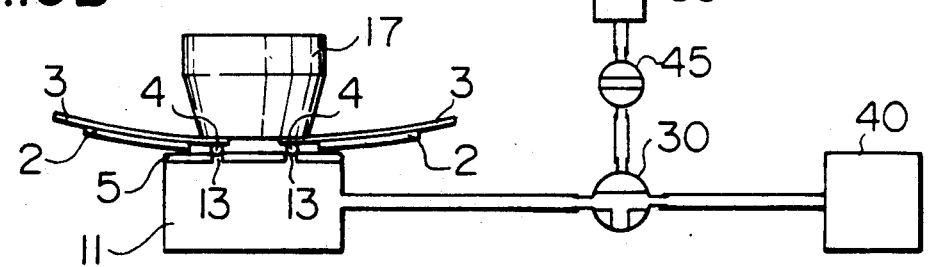
Figure 10C:
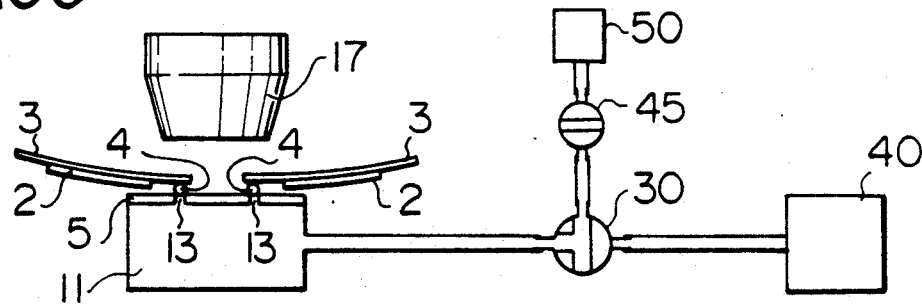
Figure 10D:
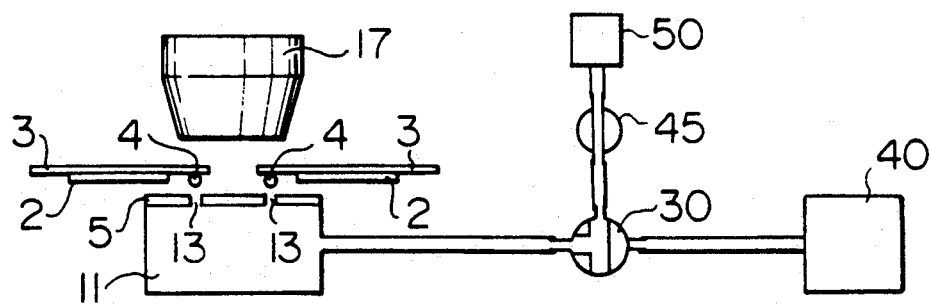

Operation from the step of alignment between the bumps and the TAB tape leads (FIG. 9A) to the step of bonding of the bumps to the leads by lowering the bonding tool (FIG. 10B) is identical with that of the embodiment 1. However, the heating temperature of the bonding tool is 420° C. and the bonding pressure is 15 gf per lead. When, the bonding tool begins to lift up for returning to the stand-by position, the change-over valve 30 is operated simultaneously to close a passage between the vacuum chamber 11 and the suction system 40 and communicate the pressurized air cylinder 50 with the vacuum chamber 11 (FIG. 10C). Subsequently, the valve 45 for pressurized air is opened so that air is introduced in the vacuum chamber 11.

In this case, the TAB tape is forcibly separated from the flat plate before lowering the vacuum chamber 11 while all the bumps are transferred to the leads of the tape.

EMBODIMENT 4

Figure 11A:
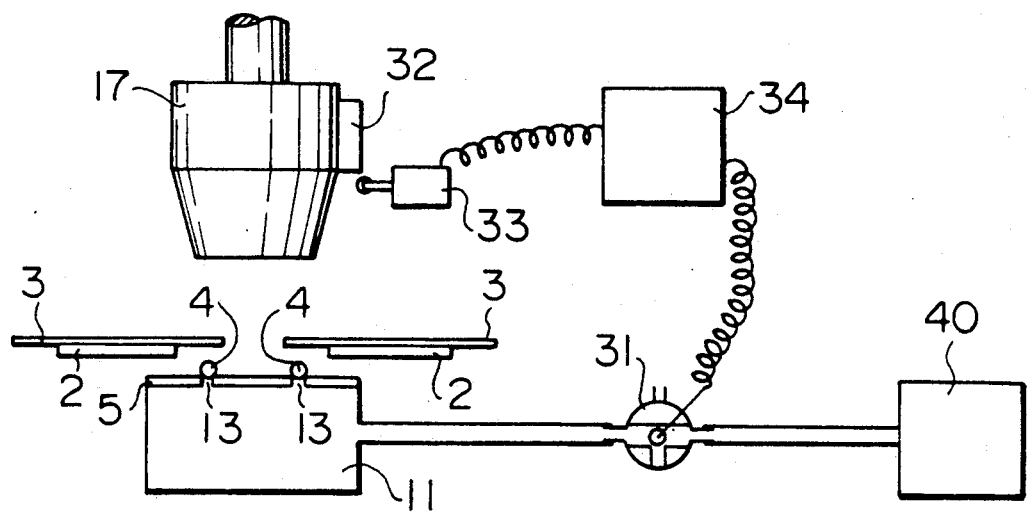
FIGS. 11A and 11B are views showing an example in which the mechanism of FIGS. 8A through 8D is automated.
Figure 11B:
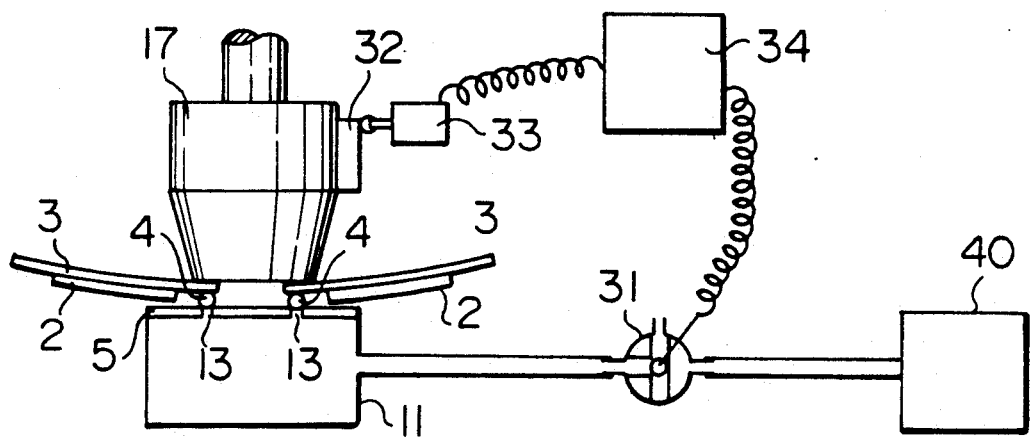

A projection 32 is provided to the side of a bonding tool 17 as shown in FIG. 11A. A change-over valve 31 disposed in a passage communicating the vacuum chamber 11 with an evacuation system 40 operates automatically to take a first position as shown in FIG. 11A or a second position as shown in FIG. 11B by a switch 33 actuated by the projection 32 and a control 34. When the switch 33 is depressed by the projection 32, the change-over valve takes the second position so that the vacuum chamber is discommunicated from the evacuation system and the outside air is allowed to leak into the vacuum chamber through the valve thereby to increase the pressure in the vacuum chamber 11 as shown in FIG. 11B. When the projection 32 is separated from the switch 33, the change-over valve takes the first position so that the vacuum chamber 11 is communicated with the evacuation system thereby evacuating the vacuum chamber as shown in FIG. 11A.

The bonding tool 7 stops in the upper stand-by position during a time interval when the vacuum chamber having the through-holes 13 of the flat plate 5 on which the bumps are sucked is set at the bonding position and the bumps are aligned with the leads 2 of the TAB tape. Accordingly, the change-over valve 31 is at the first position so that the vacuum chamber 11 is communicated to the evacuation system 40 (FIG. 11A). When the bonding tool 17 is lowered to commence the bonding step, the projection 32 provided to the side of the bonding tool 17 actuates the switch 33 so that the change-over valve 31 takes the first position so that the vacuum chamber is discommunicated from the evacuation system 40 through the control 40 and simultaneously communicated to outside thereby to introduce atmospheric pressure into the vacuum chamber 11 (FIG. 11B). The TAB tape having the leads 3 to which the bumps are transferred is separated from the flat plate 5 by lowering the vacuum chamber 11 before the time when the bonding tool is lifted up again thereby to cause the change-over valve 31 to take the first position for commencing evacuation of the vacuum chamber 11. In this embodiment, all of the 200 bumps are reliably transferred to the leads, resulting in an excellent bonding.

EMBODIMENT 5

Figure 12A:
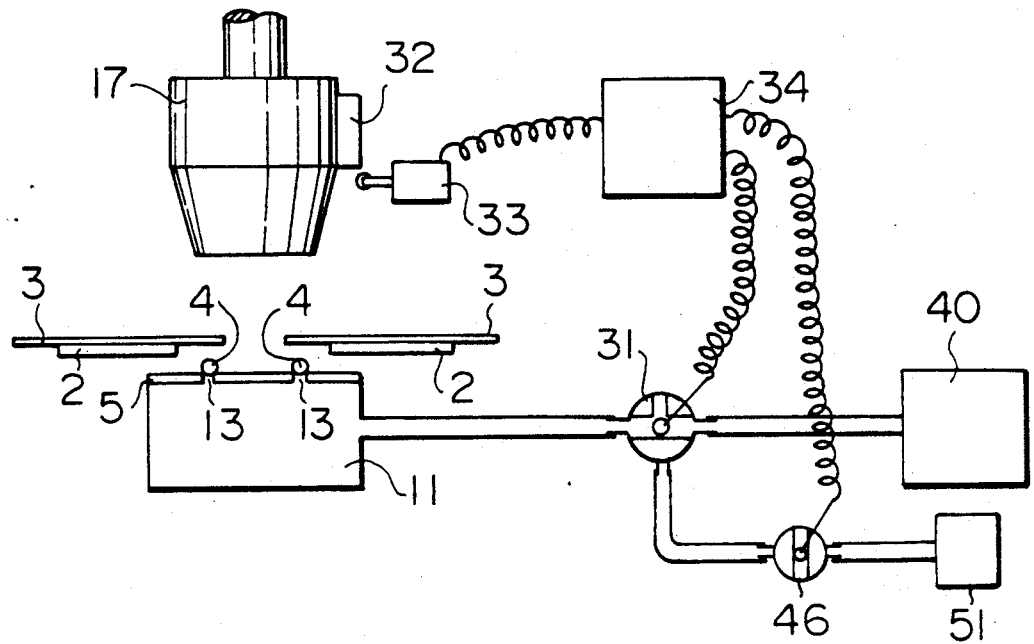
FIGS. 12A through 12B are views showing a modification of the mechanism of FIGS. 11A through 11D.
Figure 12B:
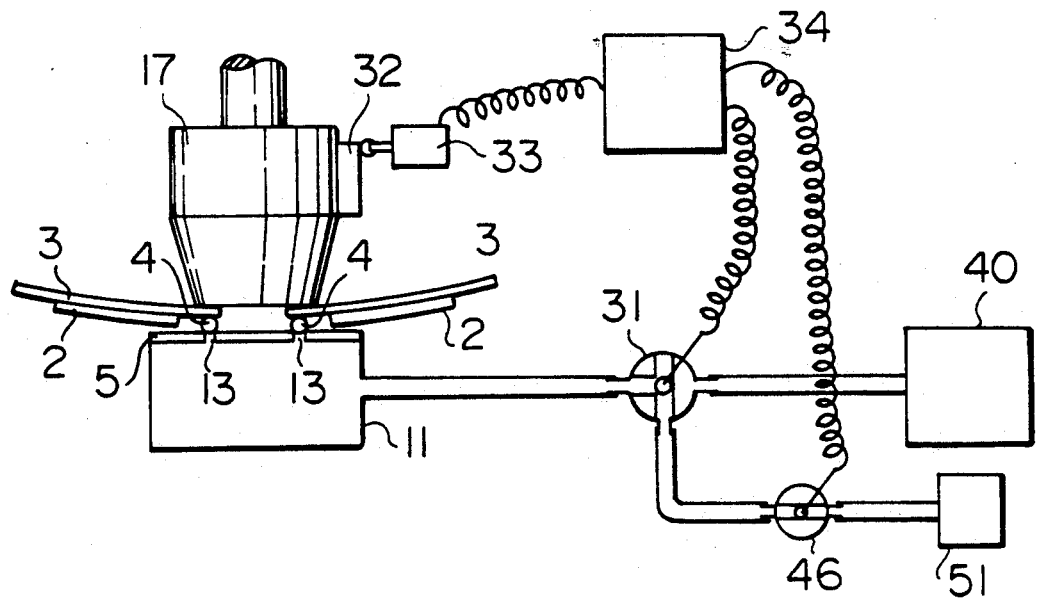

In the previous embodiment 4, one of the inlets of the change-over valve 31 is connected via an electromagnetic valve 46 to a pipe from a nitrogen gas cylinder 51 in which the gas pressure is adjusted to provide an output pressure of 0.5 atm as shown in FIG. 12A. The electromagnetic valve 46 is automatically actuated by a control 34 which receives a signal from a switch 33. The control 34 is preset in such a manner that the electromagnetic valve 46 is energized for introducing nitrogen from the cylinder 51 into the chamber 11 at two seconds after the change-over valve 31 is actuated by lowering of the bonding tool. When the projection 32 is separated from the arm of the switch 33 by lifting the bonding tool, both of the change-over valve 31 and the electro-magnetic valve 46 are returned to their original positions so that the vacuum chamber 11 is evacuated again.

Now operation of this apparatus will be described. When the bonding tool 17 is in the stand-by position, the change-over valve 31 is in such a position that the vacuum chamber 11 is communicated with the evacuation system 40 and the electro-magnetic valve 46 is kept closed. When the bonding tool 17 is lowered so that the projection 32 actuates the switch 33, the change-over switch 31 is actuated so that the vacuum chamber 11 is disconnected from the evacuation system 40 and connected with the nitrogen gas cylinder 51. At this stage, however, since the electro-magnetic valve 46 disconnects the nitrogen gas cylinder 51 from the valve 31, an almost vacuum condition is maintained in the vacuum chamber 11. The bonding tool which is heated at 400° C. is continuedly lowered during this period of time until it applies an average pressure of 15 gf to each lead for only 0.5 second so that a pressure bonding of the leads to the bumps is performed. Then, the bonding tool is moved upward.

The electro-magnetic valve 46 is operated to communicate the vacuum chamber with the nitrogen cylinder in response to a signal produced from the control 44 by the upward movement of the bonding tool so that the pressure in the vacuum chamber 11 is increased. The leads which are bonded to the bumps are lifted up smoothly so that the TAB tape can be returned to the initial preset position. Then, the TAB tape is advanced by one frame to set a next frame so that the process can be returned to a step of FIG. 12A. In such a manner, the operation of transfer of the bumps to the lead tip ends is achieved in a very efficient manner.

When balls each having a diameter of 80 μm are used in the above-mentioned embodiments, the through-holes of the flat plate 5 serving as a bump arranging substrate should be formed with a small diameter of about 60 μm. Since it is very difficult to precisely form such small through-holes in a thicker substrate, the substrate must be relatively thinner. It is found that when the thickness of the substrate exceeds 30 μm, it is very difficult to precisely form a multiplicity of through-holes each being 60 μm in diameter. However, if a thin flat plate is used, the plate could be deformed in such a manner that the peripheral edges of the through-holes are bent to form recesses due to repeated heating and application of pressure by the bonding tool in the step of transferring of the bumps to the TAB tape. There is a problem that such a deformation of the substrate causes different heights of the arranged bumps so that an excellent bump arrangement cannot be formed.

Figure 13:
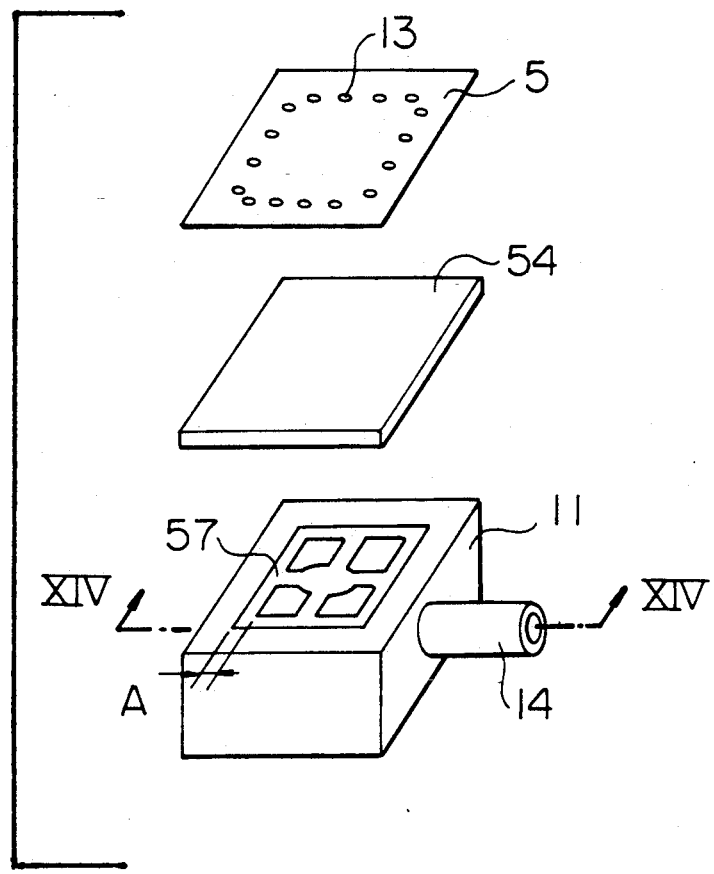
FIG. 13 is a view showing another embodiment of the vacuum suction chamber of the present invention.

In order to overcome the above-mentioned problem, a porous and air-permeable intermediate plate 54 of ceramics is interposed between a bump arranging substrate 5 which is formed with a plurality of through-holes 13 and a vacuum suction chamber 11 for reinforcing the substrate as shown in FIG. 13 in another embodiment of the present invention. The vacuum suction chamber 11 is connected to a suction apparatus (not shown) through an exhaust pipe 14. The vacuum suction chamber 11 is provided with groove-like opening 57 on the side facing to the through-holes 23 of the substrate as shown in the sectional view of FIG. 14. In the case of the substrate being 30 μm in thickness and the through-holes being 60 μm in diameter, an excellent result is obtained when the width A of the groove-like opening is 1 mm and the thickness B of the porous intermediate plate of ceramics is 1.0 mm.

Figure 14:
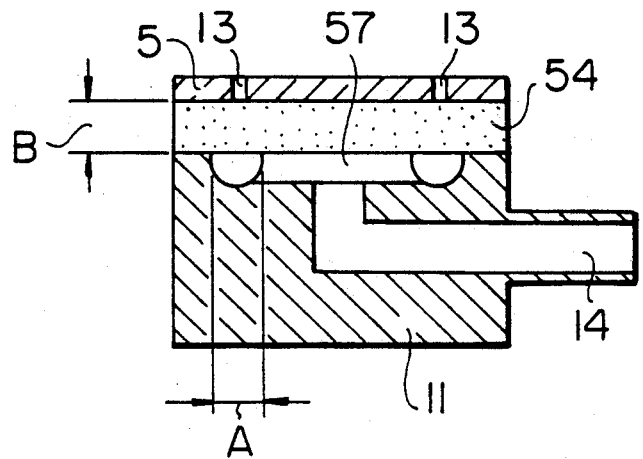
FIG. 14 is a sectional view taken along the line XIV—XIV in FIG. 13.
Figure 15:
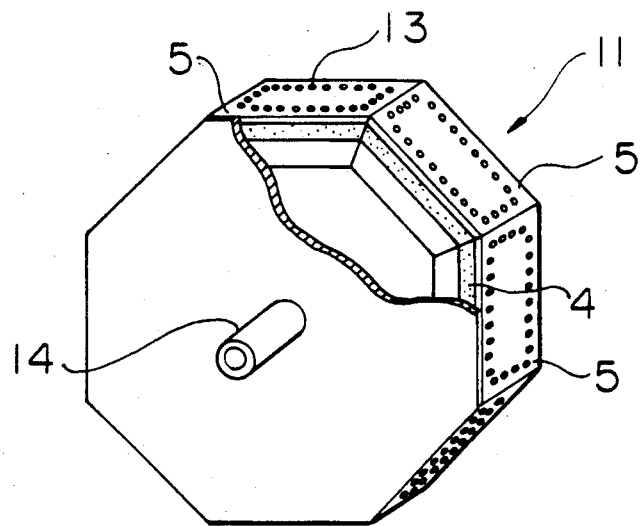
FIG. 15 is a view showing an embodiment in which the structure of FIG. 13 is used for the vacuum suction chamber of FIG. 4.

An embodiment in which the polygonal vacuum suction chamber of FIG. 4 is provided with the porous intermediate plate 54 similar to that of FIG. 14 is shown in FIG. 15. The embodiment of FIG. 15 is identical with the embodiment of FIG. 4 in structure and operation except that the porous intermediate plate 54 is provided.

The porous intermediate plate may be made of porous glass, porous metal, other than ceramics. It is not necessary to make the entire of the intermediate plate porous. A porous plate which is formed with small holes at a portion facing to the through-holes of the substrate may be used.

The substrate is reinforced by provision of a porous plate in the bump arranging apparatus in this embodiment so that the substrate is considerably strong against a pressure from the bonding tool. Therefore, deformation of the substrate and formation of the recesses around the through-holes hardly occur so that the number of times by which the substrate can be used repeatedly is remarkably increased.

Since use of the porous plate 54 enhances heat-insulating properties, the leakage of heat of the bonding tool to the vacuum suction portion 11 is greatly reduced so that transfer and bonding of the bumps can be performed very stably and efficiently.

Figure 16:
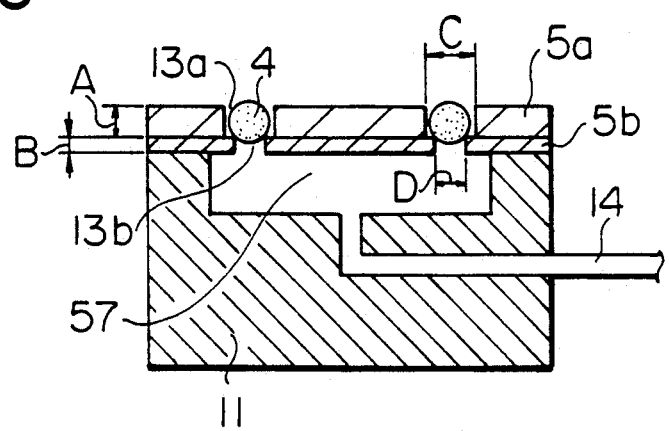
FIG. 16 is a view showing a modification of a bump arranging substrate.

A further embodiment of a bump arranging apparatus is shown in FIG. 16. The bump arranging substrate is made of two nickel substrates 5a and 5b. The upper substrate 5a is formed with the through-holes 13 each having a diameter slightly larger than that of the bump at positions in which the bumps are to be arranged. The lower substrate 5b is formed with through-holes each having a diameter slightly smaller than that of the bump in alignment with the through-holes of the upper substrate 5a. For example, for the bumps of 80 μm, the thickness A of the upper substrate 5a is 60 μm, the diameter C of the through-holes 13a is 100 μm, the thickness B of the lower substrate 5b is 30 μm and the diameter D of the through-holes 13b is 60 μm. Forming the through-holes stepwise in such a manner can prevent a defective bump arrangement such that two bumps are trapped in one through-hole and/or a bump which has been sucked once is removed from the through-hole by vibration.

The reason why the diameter of the through-hole 13a is slightly larger than that of the bump 4 is that only one bump will enter the through-hole 13a. Accordingly, when bumps having 80 μm diameter are used like the present embodiment, the diameter of the through-holes 13a is preferably in a range of 90 to 100 μm. Since the through-holes 13b play a role of sucking bumps into the through-holes 13a under a suction force, it will suffice to form the through-holes 13b smaller than the size of the bumps. The upper substrate 5a is formed in such a manner that a bump trapped in the through-hole 13a projects partially above the surface of the substrate 12a. The bump is projected above the upper surface of the substrate 5 by about 7 μm in the present embodiment and it is generally preferable that the projection height is not larger than a half of the bump diameter.

Figure 17:
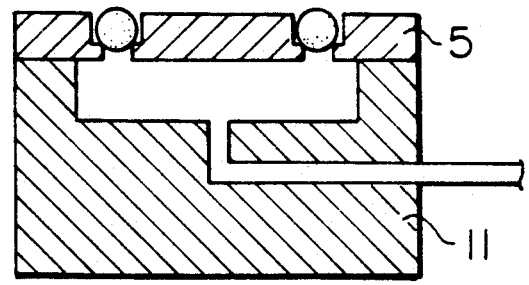
FIG. 17 is a view showing another modification of the bump arranging substrate.

An effect similar to that of the use of two bump arranging substrates 5a and 5b can be obtained by forming the through-holes 13 stepwise in one bump arranging substrate as shown in FIG. 17. The through-holes may be formed in the reversed conical shape.

Figure 18:
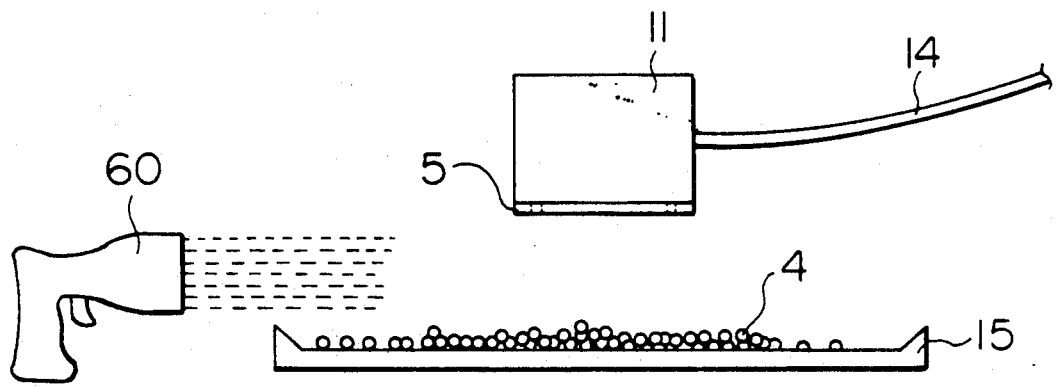
FIG. 18 is a view showing a mechanism for arranging bumps in an ionized atmosphere.

When the bumps are supplied to the bump arranging substrate, the bumps which are triboelectrically charged may be attracted with each other and a plurality of bumps may be collected in one through-hole and/or be attracted to positions other than the through-holes. An embodiment to prevent this is illustrated in FIG. 18. In this embodiment, the bumps 4 are irradiated with ion beams from an ion generator 40, when the bumps are sucked to the substrate 5 of the vacuum suction chamber 11 from a bump supply 15. Such an irradiation with ion beams causes the bumps to be electrically neutrized by discharging electricities in the ionized gases since the bumps are transferred through ionized atmosphere to the substrate 5. Mutual attraction of the bumps is avoided so that collection of plurality of pumps in one through-hole is prevented. For example, an ion gun manufactured by Shimco Japan Kabushiki Kaisha may be used as the ion generator. Alternatively, an air injected from a compressor is ionized and generated ions may be blown upon the bumps.

Figure 19:
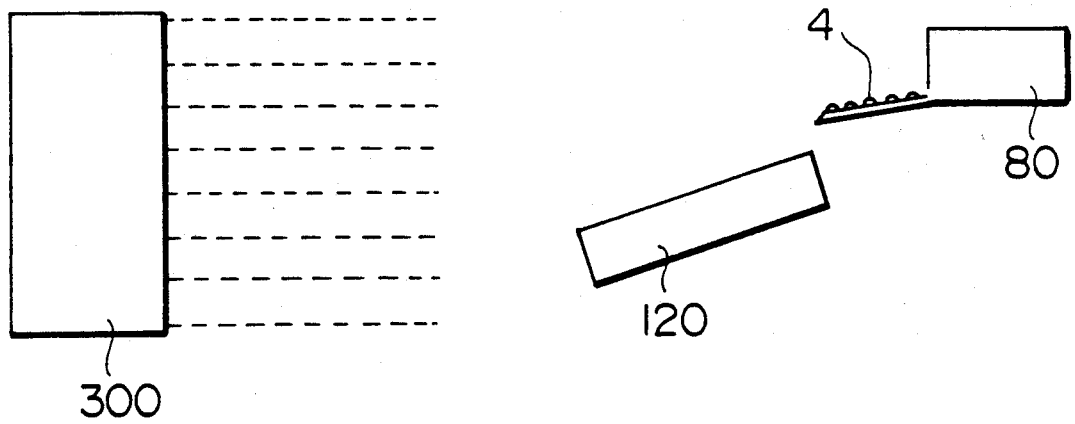
FIG. 19 is a view showing another mechanism for arranging bumps in an ionized atmosphere.
Figure 20A:
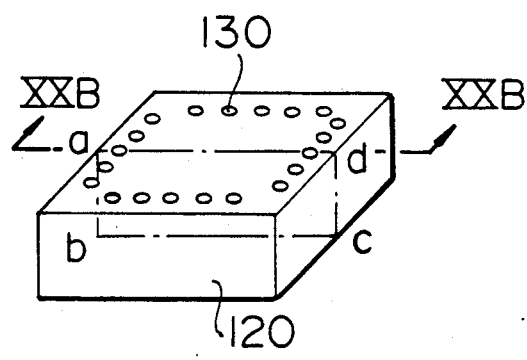
FIGS. 20A and 20B are perspective and sectional views, respectively, showing a structure of bump arranging substrate used for the mechanism of FIG. 19.
Figure 20B:
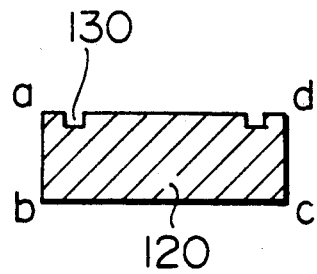

FIG. 19 is a view showing a further embodiment in which ion beams are irradiated. The bumps 4 are dropped upon an inclined substrate 120 from a bump supply 80 so that the bumps 4 rolls on the substrate 120. Ionized gas is blown to the falling bumps from an ion blower 300 (Model A300 manufactured by Shimco Japan Kabushiki Kaisha). Since there is no mutual attraction among bumps in this case, a substrate which is formed at the bump arranging positions with recesses 130 each having a diameter slightly larger than that of bump traps the bumps in the recesses as shown in FIGS. 20A and 20B so that an individual bump can be readily arranged in each recess without evacuation at the opposite side of the substrate.

A bump arranging substrate which is formed with through-holes or recesses is used in the afore-mentioned embodiment. Laser machining, electroforming, precise electric discharge machining processes and the like are used for forming through-holes in the substrate. Even if any process is used, formation of round through-hole having a diameter of 60 μm is a limit of fabrication for a substrate having a practical thickness. It is desired that these through-holes give no damages to bumps made of very small size metal spheres.

On the other hand, metal spheres each having a smaller diameter are used as bumps in association with increase in packaging density of semiconductors. For example, bumps each having a diameter less than 50 μm may be demanded. Accordingly, precise fabrication of through-holes having a small diameter is demanded for a bump arranging substrate used for these small bumps. As the bumps become smaller in size, the possibility that small burrs remained at the peripheral edges of the through-holes are obstructive to transferring of the bumps to the TAB tape becomes larger. Therefore, smoothing the peripheral edges of the through-holes is strongly demanded for a bump arranging substrate in addition to forming small through-holes.

In order to achieve this, it is effective in formation of the through-holes to reduce the diameter of the through-holes which are initially formed with a diameter slightly larger than the desired diameter to a desired diameter by plating on the walls thereof. A known chemical nickel plating method can be used for the plating.

There are varieties of the bump arranging substrates such as a substrate which is formed, in order to use a thicker material, with two stepped through-holes having a larger diameter on the side where bumps are arranged and a smaller diameter on the opposite side where evacuation is performed, a substrate which is formed, in order to prevent a plurality of bumps from collecting in one through-hole, with through-holes having a smaller diameter on the right side and a larger diameter on the opposite side and a substrate formed with through-holes each having a diameter of the intermediate portion smaller than those on both sides so that both effects are combined. The after-mentioned plating method may be effectively used for any type of substrate.

TEST 5

Bump arranging substrates each having a thickness of 0.1 mm made of stainless steel are used for bonding gold bumps on the leads of a TAB tape used for packaging an IC chip having a total 200 electrodes in 140 μm pitch along peripheral four sides. Two kinds of arranging substrates are used. Each of No. 1 series substrates 1 is a conventional substrate (as a control) which is formed with 200 through-holes each having a diameter of 60 μm in a pattern corresponding to that of the electrodes of the chip by the electric discharge machining method. Each of No. 2 series substrates 2 of the present embodiment is formed with through-holes having a diameter of 65 μm by the precise electric discharge machining and then coated with nickel by the chemical plating method so that the inner diameter of the through-holes is reduced to 60 μm, which is the same as that of the through hole of the substrate 1.

Bonding of the bumps to the leads of the TAB tape (primary bonding) is performed by using these two kinds of substrates and small metal spheres of 80 μm diameter as bumps. The bonding conditions of both kinds of bumps are such that the temperature of the tool is 500° C. and the applied pressure is 20 gf/lead. Primary bonding of 20 frames of each of substrates 1 and 2 is conducted.

The results of the test are shown in Table 1. Primary bonding shows different bonding rates between the two series of the substrates 1 and 2. Bumps are not completely bonded to leads in some of No. 1 series of the substrates 1. This is due to a fact that the bumps are trapped by the burrs around the through-holes of the substrates 1 and not smoothly removed therefrom. Such a problem never occur for No. 2 series of the substrates 2. Very stable primary bonding is conducted.

It is understood from above test that the primary bonding rate i.e. the ratio of the number of bumps which are reliably bonded to the leads to the total number of the bumps in one frame, is improved even when the substrate of this embodiment is formed with through-holes having the same size as that of conventional substrate.

TABLE 1

| No. | Substrate | Bump diameter | Bonding rate (%) |
| --- | --- | --- | --- |
| 1 | Substrate 1 (control) | 80 μm | 100.0 |
| 2 | Substrate 1 (control) | " | 100.0 |
| 3 | Substrate 1 (control) | " | 99.0 |
| 4 | Substrate 1 (control) | " | 100.0 |
| 5 | Substrate 1 (control) | " | 100.0 |
| 6 | Substrate 1 (control) | " | 98.5 |
| 7 | Substrate 1 (control) | " | 100.0 |
| 8 | Substrate 1 (control) | " | 100.0 |
| 9 | Substrate 1 (control) | " | 100.0 |
| 10 | Substrate 1 (control) | " | 99.5 |
| 11 | Substrate 2 (with plating) | " | 100.0 |
| 12 | Substrate 2 (with plating) | " | 100.0 |
| 13 | Substrate 2 (with plating) | " | 100.0 |
| 14 | Substrate 2 (with plating) | " | 100.0 |
| 15 | Substrate 2 (with plating) | " | 100.0 |
| 16 | Substrate 2 (with plating) | " | 100.0 |
| 17 | Substrate 2 (with plating) | " | 100.0 |
| 18 | Substrate 2 (with plating) | " | 100.0 |
| 19 | Substrate 2 (with plating) | " | 100.0 |
| 20 | Substrate 2 (with plating) | " | 100.0 |

TEST 6

A TAB tape which is the same as that TEST 5 is used. After a substrate made of stainless steel having a thickness of 0.1 mm is formed with through-holes each having a diameter of 60 μm by the electric discharging machining process, the substrate is plated with nickel so that the diameter of each through-hole is reduced to 50 μm. Small gold balls each having a diameter of 60 μm are arranged on the substrate. Primary bonding of the balls to the leads of 10 frames of the TAB tape is conducted. The bonding rate of the primary bonding is 100% in all the substrates.

Then, secondary bonding for bonding bump-bonded TAB tape leads to IC chip electrodes is carried out in ten samples using ten frames of the TAB tape to which bumps each having a diameter of 10 μm have been bonded and 10 samples using ten frames of the TAB tape, as listed in Nos. 11 to 20 in TEST 5, to which bumps each having a diameter of 80 μm have been bonded.

In several cases of the TAB tape using the bumps each having a diameter of 80 μm, short-circuiting between adjacent leads occurs due to deformation of the bumps on bonding while no short-circuiting occurs in the TAB tape to which bumps each having a diameter of 60 μm are bonded. This shows that use of the bumps which are relatively smaller in diameter gives less possibility of short-circuiting between adjacent leads so that a stable TAB packaging can be achieved even if the IC chip is not a high-density-packaged chip having a specially narrow lead pitch.

It is confirmed that the substrate of the present embodiment is effective to provide an arranging substrate with small through-holes which can be used for arranging smaller bumps.

TEST 7

An arranging substrate made of a conductive ceramics having a thickness of 0.3 mm is used to bond gold bumps to the leads of the TAB tape used for packaging an IC chip having total 328 electrodes at 102 μm pitch along the peripheral four sides. The arranging substrate is formed with stepped through-holes in alignment with the electrodes arranged in pattern. That is, first, provisional holes each having a diameter of 100 μm are formed to a depth of about 250 μm in a rear side of the substrate by the precise electric discharging machining and then through-holes each having a diameter of 40 μm are formed by laser machining at the positions of the provisional holes. In this case, the provisional holes each having 100 μm diameter are not isolated from each other since adjacent holes are overlapped with each other around the periphery thereof. However, the through-holes having 40 μm diameter are formed on the front side of the substrate. The two-step method of forming through-holes is advantageous when it is necessary to use a thicker substrate to assure a strength of the substrate but it is very difficult to directly form through-holes having 40 μm diameter in a thicker substrate having a thickness of 0.3 mm, for example.

The diameter of holes measured at the front side of the substrate is reduced to 35 μm by plating the resultant substrate with nickel. Since the substrate of electrically conductive ceramics has a tendency that the surface becomes rough by laser machining in comparison with the substrate of stainless steel used in TEST 6, it is useful in that the plating provides an effect for reducing the hole diameter as well as an effect for smoothing the surface around the holes thereby making the separation of bumps easier.

A primary bonding test is performed for ten samples each using the substrate made in the above manner. In each sample, the bumps of small gold balls each having a diameter of 45 μm are arranged at positions of through-holes each having a diameter of 35 μm formed in the substrate made in the above manner by reducing the pressure in the rear side of the substrate. Then the bumps thus arranged in ten samples are bonded to the leads of ten frames of TAB tape, respectively, by using bonding tool under a condition that the tool temperature is 520° C. and the applied pressure is 20 gf/lead. The primary bonding rate is 100% for the 10 samples. Further, the secondary test is carried out for the ten samples as above-mentioned. In each sample, the leads of the bump-bonded TAB tape thus made are bonded to electrodes of IC chip by using bonding machine under a condition that the tool temperature is 540° C. and the applied pressure is 60 gf/lead. In the secondary test, the secondary bonding rate is 100% with no short-circuiting between adjacent leads.

TEST 8

An arranging substrate made of stainless steel having a thickness of 0.1 mm is used to bond gold bumps to the leads of the TAB tape used for packaging an IC chip having total 328 electrodes at 102 μm pitch along the peripheral four sides, which is similar to that of TEST 7. The arranging substrate is formed with stepped through-holes which are inverse to those of TEST 3 in alignment with the arrangement pattern of the electrodes. That is, first, provisional holes each having a diameter of 50 μm are formed in the front side of the substrate to a depth of 30 μm by precise electric discharging machining and the through-holes of 40 μm diameter are formed at the positions of the provisional holes by laser machining. Although it is hard to bore the 70 μm thick substrate with through-holes of 40 μm diameter, through-holes each having excellent roundness is obtained by rotating the substrate in a plane perpendicular to the direction of laser light radiation, while a focussed laser spot beam is repeatedly radiated.

The substrate is coated by plating with nickel until the 40 μm diameter of the through-holes is reduced to 35 μm when measured at a depth of 30 μm from the front side of the substrate. The diameter of the through-holes measured at the front side of the substrate, which is originally 50 μm, is also reduced to about 45 μm.

A primary bonding test for bonding small gold balls each having a diameter of 40 μm arranged on the substrate made in the above manner to the leads of the TAB tape is conducted as follows: Small gold balls each having a diameter of 40 μm are sucked by reducing the pressure in the rear side of the substrate and dropped in the holes each having a diameter of 45 μm at the front side of the substrate. The dropped balls are held by stepped portions each having a diameter of 35 μm, of the holes and provisionally secured there. If a usual flat substrate is used for arranging such small balls, a plurality of gold balls may be often sucked to one hole. Since the substrate used in the present embodiment has in the front side holes each having a diameter slightly larger than the diameter of small balls, only one small ball is allowed to fall in the hole and then trapped by the step-portion of the hole having 35 μm diameter by a suction force exerted by reducing the pressure in the rear side. Even if another small gold ball approaches to the same hole, suction force is not applied to this ball. Accordingly, it is possible to prevent a plurality of very small gold balls from being collected in one through-hole.

Since the diameter of each hole is 45 μm at a portion from the front surface of the substrate to its depth of 30 μm which is slightly smaller than the diameter of the small gold balls, the tops of the small balls project above the front surface of the substrate by 5 μm when arranged thereon. Therefore, there is no difficulty in bonding the balls on the substrate to the leads of the TAB tape.

It is confirmed that the substrate having stepped through-holes, of which the diameter is larger at its front side than its rear side, is very effective to treat very small bumps as mentioned-above.

In order to manufacture a TAB tape having leads disposed at very small pitches and bonded with very small bumps, it is required to provide an arrangement of small metal balls which is used for bonding the bumps to the leads of the TAB tape. By the above embodiment, it is possible to realize a substrate adapted to be used for making such an arrangement of very small metal balls or spherical bumps which are hitherto very difficult to be practically used. As a result, it becomes possible to realize high density packaging which is a feature of TAB process by using very small spherical bumps which are excellent in bonding properties and eliminating a problem of very small burns on the substrate which prevents smooth transfer of bumps to the leads of TAB tape thereby realizing stable primary bonding.

Further, in the TABs having leads at pitches which have been conventionally realized, it is possible to prevent short-circuiting between adjacent leads in the secondary bonding for connecting the leads of TAB tape to the electrodes of IC chip by using smaller spherical bumps for the TAB tape.

We claim:

1. A method of bonding bumps to leads of a TAB tape comprising the steps of:
   preparing a substrate which is provided with through-holes, each having a size which does not allow the bumps to pass therethrough, at positions corresponding to bonding positions of the leads of the TAB tape where the bumps are to be bonded;
   provisionally arranging the bumps at positions of the through-holes at one side of the substrate by reducing a pressure in another side of the substrate opposite to said one side to suck the bumps in said through-holes;
   disposing the substrate on which the bumps are provisionally arranged and said TAB tape in such a positional relationship that said bumps face to the bonding positions of the leads of said TAB tape; and
   bonding the provisionally arranged bumps to the leads at the bonding positions.

2. A method according to claim 1 in which said bonding step is carried out by operating a bonding machine while said substrate on which said bumps are arranged and the leads of said TAB tape are disposed in an operating position of said bonding machine and said provisionally arranging step is carried out prior to carrying out said bonding step while disposing said substrate at the operating position of said bonding machine.

3. A method according to claim 1 in which said bonding step is carried out by operating a bonding machine while said substrate on which said bumps are arranged and the leads of said TAB tape are disposed at an operating position of said bonding machine and said provisionally arranging step is carried out prior to carrying out said bonding step while disposing said substrate at a remote position remote from the operating position of said bonding machine. said substrate on which said bumps are arranged is returned to the operating position of said bonding machine prior to carrying out said bonding step.

4. A method according to claim 1 in which said substrate is integrally combined as an integral unit with a pressure reducing chamber capable of reducing the pressure in the other side of said substrate and movable between a first position where said substrate is located at an operating position of a bonding machine and a second position where said substrate is remoted from the operating position of said bonding machine and in which said bonding step is carried out by operating the bonding machine while said substrate on which said bumps are arranged and the leads of said TAB tape are disposed at the operating position of the bonding machine by moving said integral unit to its first position and said provisionally arranging step is carried out prior to carrying out said bonding step by operating said pressure reducing machine while moving said integral unit to said second position.

5. A method according to claim 4 in which said integral unit is rotatable so as to pass said operating position and inoperating position during its one rotation.

6. A method according to claim 1 in which said provisionally arranging step is carried out by reducing a pressure in a pressure reducing chamber provided to said other side of said substrate and said method further comprises the steps of separating said TAB tape after the bonding step from said pressure reducing chamber and increasing the pressure in said pressure reducing chamber at least during the separating step.

7. A method according to claim 1 in which said provisionally arranging step is carried out by reducing a pressure in a pressure reducing chamber provided to said other side of said substrate and formed with a small hole.

8. A method according to claim 1 in which said provisionally arranging step is carried out by reducing a pressure in a pressure reducing chamber provided to said other side of said substrate with an intermediate porous and air-permeable plate therebetween.

9. A method according to claim 1 in which each of said through-holes has a diameter of a first value measured at the one side of said substrate and a second value measured at the other side of said substrate and different from the first value.

10. A method according to claim 9 in which said first value is larger than said second value.

11. A method according to claim 1 in which said substrate includes two laminated plates which are integrally bonded with each other and formed with short through-holes of different diameters, respectively, at positions corresponding to the positions of the through-holes of said substrate.

12. A method according to claim 1 in which each of said through-holes is initially formed with a diameter larger than a desired diameter and adjusted to the desired diameter by plating.

13. A method according to claim 1 in which said provisionally arranging step is carried out in an ionized atmosphere.

* * * * *